US011776947B2

(12) United States Patent
Oba et al.

(10) Patent No.: US 11,776,947 B2
(45) Date of Patent: Oct. 3, 2023

(54) ELECTRONIC COMPONENT AND MANUFACTURING METHOD THEREFOR

(71) Applicant: TDK CORPORATION, Tokyo (JP)

(72) Inventors: Yusuke Oba, Tokyo (JP); Kenichi Yoshida, Tokyo (JP); Takashi Ohtsuka, Tokyo (JP); Yuichiro Okuyama, Tokyo (JP); Tomoya Hanai, Tokyo (JP); Yu Fukae, Tokyo (JP)

(73) Assignee: TDK CORPORATION, Tokyo (JP)

( * ) Notice: Subject to any disclaimer, the term of this patent is extended or adjusted under 35 U.S.C. 154(b) by 158 days.

(21) Appl. No.: 17/206,656

(22) Filed: Mar. 19, 2021

(65) Prior Publication Data

US 2021/0305231 A1    Sep. 30, 2021

(30) Foreign Application Priority Data

Mar. 25, 2020   (JP) .................. 2020-054874

(51) Int. Cl.
| | |
|---|---|
| *H01L 25/18* | (2023.01) |
| *H01L 27/01* | (2006.01) |
| *H01L 21/70* | (2006.01) |
| *H01L 21/78* | (2006.01) |
| *H01L 49/02* | (2006.01) |

(52) U.S. Cl.
CPC ............ *H01L 25/18* (2013.01); *H01L 21/707* (2013.01); *H01L 21/78* (2013.01); *H01L 27/016* (2013.01); *H01L 28/10* (2013.01); *H01L 28/40* (2013.01)

(58) Field of Classification Search
CPC ..... H01L 27/016; H01L 21/707; H01L 21/78; H01L 28/10; H01L 28/40; H01L 28/60; H01L 28/75; H01L 23/5222; H01L 23/5223; H01L 23/5225; H01L 25/16; H01L 25/167; H01L 25/18
See application file for complete search history.

(56) References Cited

U.S. PATENT DOCUMENTS

| | | | | |
|---|---|---|---|---|
| 6,284,617 B1 * | 9/2001 | Erdeljac | .............. | H01L 23/5227 257/E21.022 |
| 6,534,374 B2 * | 3/2003 | Johnson | .............. | H01L 23/5228 257/E21.582 |
| 6,545,225 B2 * | 4/2003 | Copetti | ................. | H01L 27/016 174/262 |
| 7,535,079 B2 * | 5/2009 | Remmel | ............... | H01L 27/016 257/532 |
| 7,772,080 B2 * | 8/2010 | Frye | ........................ | H01L 23/60 438/106 |

(Continued)

FOREIGN PATENT DOCUMENTS

| | | |
|---|---|---|
| JP | 2007142109 A | 6/2007 |
| JP | 2008034626 A | 2/2008 |

*Primary Examiner* — Eduardo A Rodela
(74) *Attorney, Agent, or Firm* — YOUNG LAW FIRM, P.C.

(57) ABSTRACT

Disclosed herein is an electronic component that includes a substrate, a functional layer formed on the substrate and having a plurality of alternately stacked conductor layers and insulating layers, and a plurality of terminal electrodes provided on an uppermost one of the insulating layers. The uppermost one of the insulating layers has a substantially rectangular planar shape and has a protruding part protruding in a planar direction from at least one side in a plan view.

3 Claims, 14 Drawing Sheets

(56) References Cited

U.S. PATENT DOCUMENTS

| | | | |
|---|---|---|---|
| 8,241,952 B2* | 8/2012 | Lin .................... | H01L 21/561 438/109 |
| 8,409,970 B2* | 4/2013 | Lin .................... | H01L 28/20 438/464 |
| 9,368,460 B2* | 6/2016 | Yu ..................... | H01L 23/5389 |
| 9,741,674 B2* | 8/2017 | Tsukahara ........... | H01L 23/3114 |
| 10,027,282 B2* | 7/2018 | Sugitani .............. | H01L 23/5227 |
| 10,483,174 B1* | 11/2019 | Liu ..................... | H01L 24/06 |
| 11,587,900 B2* | 2/2023 | Tseng ................. | H01L 25/105 |
| 2006/0291029 A1* | 12/2006 | Lin .................... | H01L 21/76801 257/E21.589 |
| 2007/0109719 A1 | 5/2007 | Kuwajima et al. | |
| 2007/0114634 A1* | 5/2007 | Lin .................... | H01L 23/50 257/E23.079 |
| 2007/0235878 A1* | 10/2007 | Lin .................... | H01L 24/05 257/773 |
| 2008/0023219 A1 | 1/2008 | Yoshizawa et al. | |
| 2009/0315142 A1* | 12/2009 | Burke ................. | H01L 21/76846 257/E29.325 |
| 2019/0148370 A1* | 5/2019 | Hung .................. | H01L 27/0794 257/532 |
| 2021/0219430 A1* | 7/2021 | Okuyama ............ | H05K 1/0209 |
| 2021/0265313 A1* | 8/2021 | Chen .................. | H01L 23/528 |

* cited by examiner

ELECTRONIC COMPONENT AND MANUFACTURING METHOD THEREFOR

BACKGROUND OF THE INVENTION

Field of the Invention

The present invention relates to an electronic component and a manufacturing method therefor and, more particularly, to an electronic component that is mounted upside down on a motherboard such that a substrate thereof is positioned on the upper side and a manufacturing method therefor.

Description of Related Art

JP 2007-142109A and JP 2008-34626A disclose an electronic component in which a capacitor and an inductor are formed on a substrate thereof. The electronic component described in JP 2007-142109A and JP 2008-34626A has a lower electrode and an inductor pattern which are formed on a conductor layer of the lowermost layer, a dielectric film covering the lower electrode and inductor pattern, and an upper electrode facing the lower electrode through the dielectric film. A conductor layer of the uppermost layer constitutes a terminal electrode, and the thus configured electronic component is mounted upside down on a motherboard such that the substrate is positioned on the upper side. After the electronic component is mounted on the motherboard, an underfill may be filled in a gap between the motherboard and the electronic component for the purpose of increasing mounting reliability.

However, when the gap between the motherboard and electronic component is small, the underfill is difficult to enter the gap between the motherboard and the electronic component.

SUMMARY

It is therefore an object of the present invention to provide an electronic component, which is designed to be mounted upside down on a motherboard such that the substrate thereof is positioned on the upper side, having a structure facilitating smooth penetration of underfill and a manufacturing method therefor.

An electronic component according to the present invention includes a substrate, a functional layer formed on the substrate and having a plurality of alternately stacked conductor layers and insulating layers, and a plurality of terminal electrodes provided on the insulating layer positioned in the uppermost layer of the insulating layers, wherein the insulating layer positioned in the uppermost layer has a substantially rectangular planar shape and has a protruding part protruding in the planar direction from at least one side in a plan view.

According to the present invention, the underfill supplied after the electronic component is mounted upside down on a motherboard penetrates into a gap between the motherboard and the electronic component due to surface tension originating from the protruding part. Thus, even when the gap between the motherboard and the electronic component is small, the underfill can easily penetrate into the gap.

In the present invention, the protruding part may overlap the substrate in a plan view. This prevents the planar size of the electronic component from increasing due to the presence of the protruding part.

In the present invention, the protruding part may be positioned in substantially the center portion of one side. This allows the underfill entering from the protruding part to easily spread over the entire gap between the motherboard and the electronic component. In this case, the plurality of terminal electrodes may include first and second terminal electrodes, the side of the insulating layer positioned in the uppermost layer may have first and second sections adjacent respectively to the first and second terminal electrodes, and the protruding part may be positioned between the first and second sections. This arrangement enables the underfill to penetrate between the mother board and the electronic component avoiding the terminal electrodes.

An electronic component manufacturing method according to the present invention includes a first step of alternately stacking a plurality of conductor layers and insulating layers on an aggregated substrate and a second step of dicing the aggregate substrate into a plurality of individual electronic components including mutually adjacent first and second electronic components, wherein the insulating layer positioned in the uppermost layer of the plurality of insulating layers includes a first part belonging to the first electronic component, a second part belonging to the second electronic component, and a bridge part partially connecting the first and second parts, the first step includes a step of forming a seed layer on the entire surface of the insulating layer positioned in the uppermost layer and performing electroplating using the seed layer as a feeder to form a plurality of terminal electrodes, and the second step includes a step of cutting the bridge part.

According to the present invention, the insulating layer positioned in the uppermost layer has the bridge part, so that even if peeling occurs due to shrinkage of the insulating layer, the sheet layer does not undergo electrical disconnection. This allows electroplating using the seed layer as a feeder to be performed correctly. In addition, the protruding part is formed in the uppermost insulating layer as a result of cutting the bridge part in the second step, promoting penetration of underfill.

As described above, according to the present invention, there can be provided an electronic component having a structure facilitating smooth penetration of the underfill and a manufacturing method therefor.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
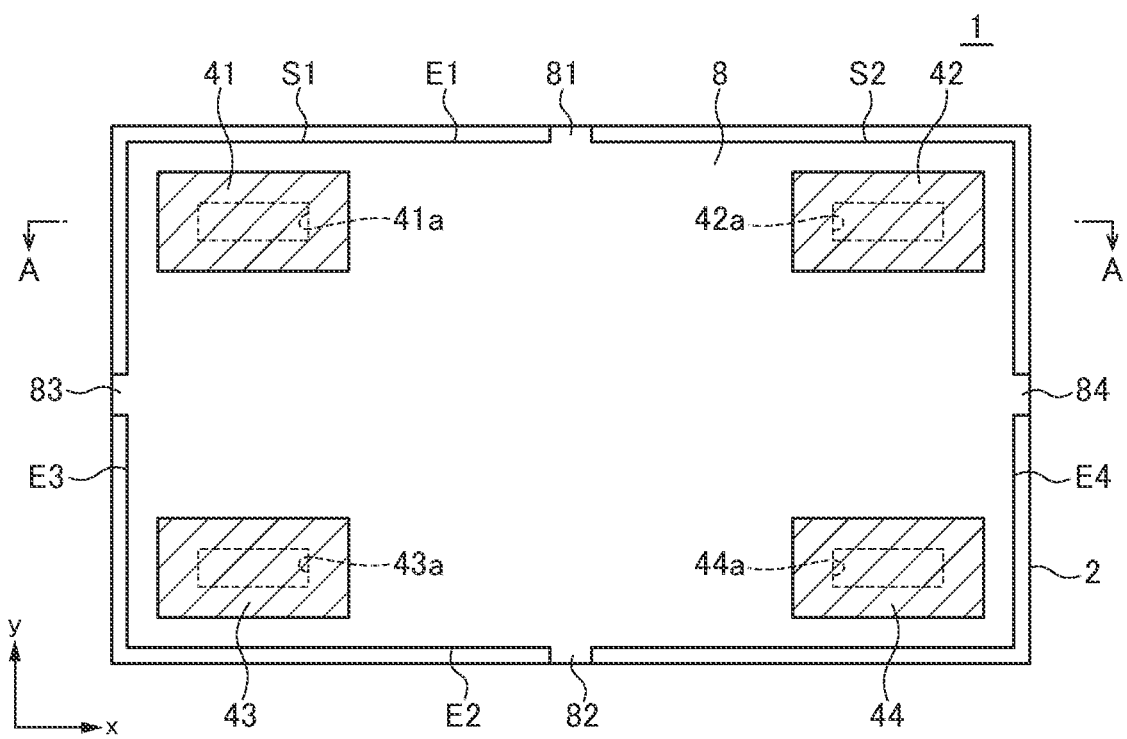
FIG. 1 is a schematic plan view for explaining the structure of an electronic component 1 according to an embodiment of the present invention.
Figure 2:
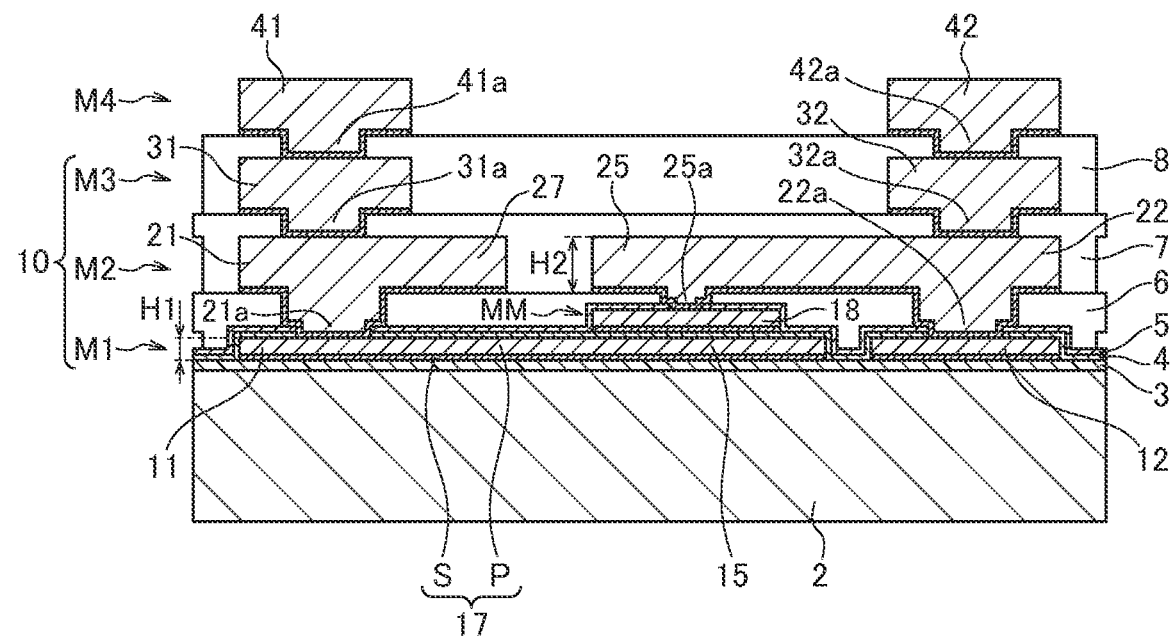
FIG. 2 is a schematic cross-sectional view taken along line A-A in FIG. 1.

FIG. 1 is a schematic plan view for explaining the structure of an electronic component 1 according to an embodiment of the present invention. FIG. 2 is a schematic cross-sectional view taken along line A-A in FIG. 1.

Figure 4:
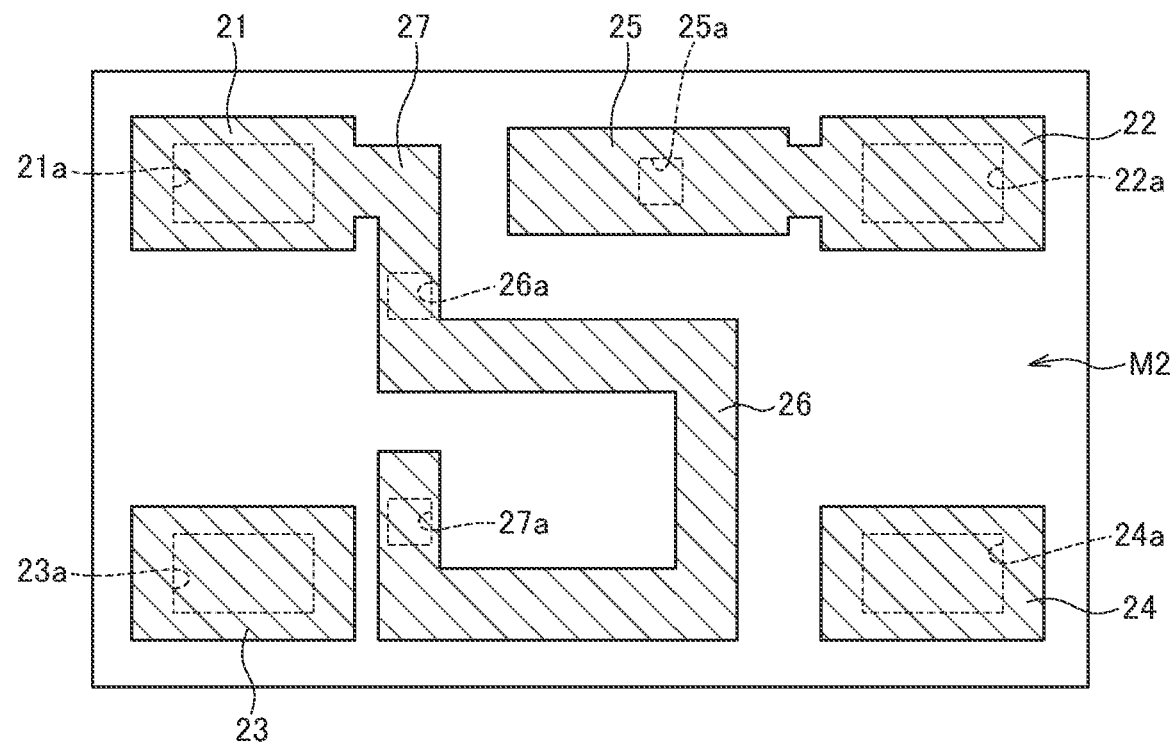
FIG. 4 is a schematic plan view for indicating a pattern shape of a conductor layer M2.
Figure 5:
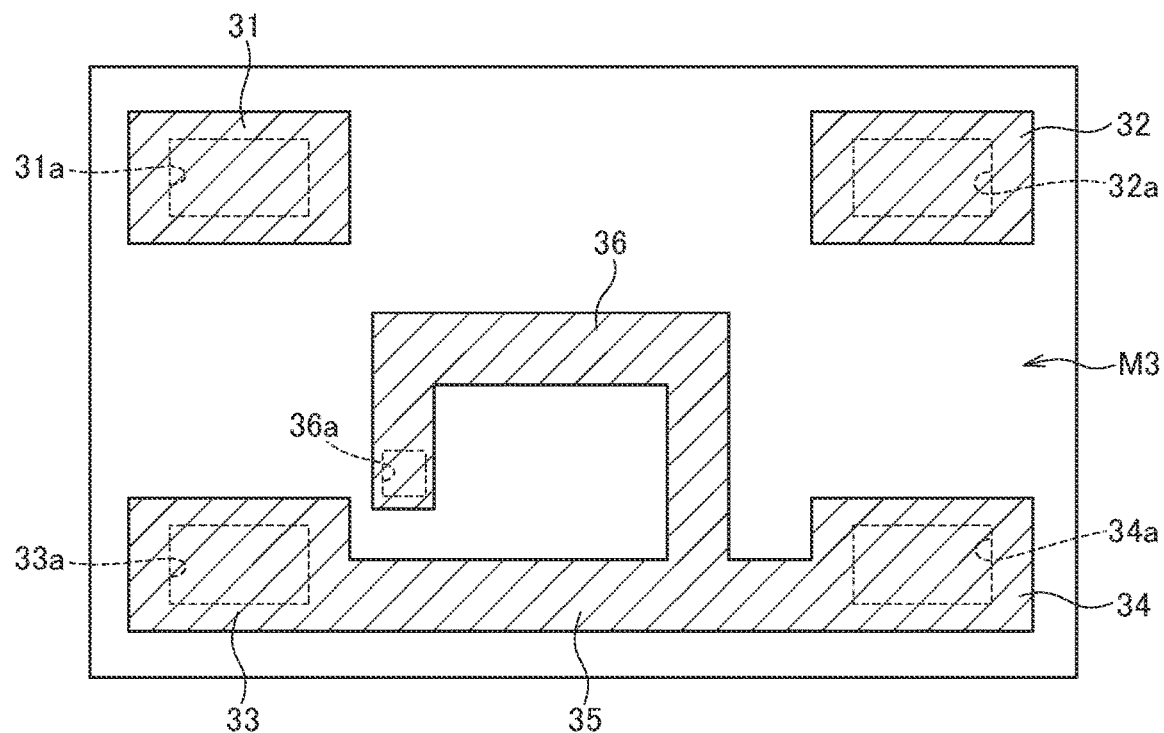
FIG. 5 is a schematic plan view for indicating a pattern shape of a conductor layer M3.

The electronic component 1 according to the present embodiment is an LC filter and includes, as illustrated in FIGS. 1 and 2, a substrate 2 and conductor layers M1, MM, M2, M3, M4 and insulating layers 6 to 8 which are formed on the main surface of the substrate 2. The insulating layers 6 to 8 are each made of a resin material having a high insulating property. The conductor layers M1 to M4 and insulating layers 6 to 8 are alternately stacked, and a part including the conductor layers M1, MM, M2, M3, M4 and insulating layers 6 to 8 constitutes a functional layer 10 functioning as the LC filter. The pattern shapes of the conductor layers M1 and MM are illustrated in FIG. 3, the pattern shape of the conductor layer M2 is illustrated in FIG. 4, the pattern shape of the conductor layer M3 is illustrated in FIG. 5, and the pattern shape of the conductor layer M4 is illustrated in FIG. 1.

The material for the substrate 2 may be any material as long as it is chemically and thermally stable, generates less stress, and can maintain surface smoothness, and examples thereof include, but not particularly limited to, silicon single crystal, alumina, sapphire, aluminum nitride, MgO single crystal, $SrTiO_3$ single crystal, surface-oxidized silicon, glass, quartz, and ferrite. The surface of the substrate 2 is covered with a planarizing layer 3. The planarizing layer 3 may be made of, e.g., alumina or silicon oxide.

Figure 3:
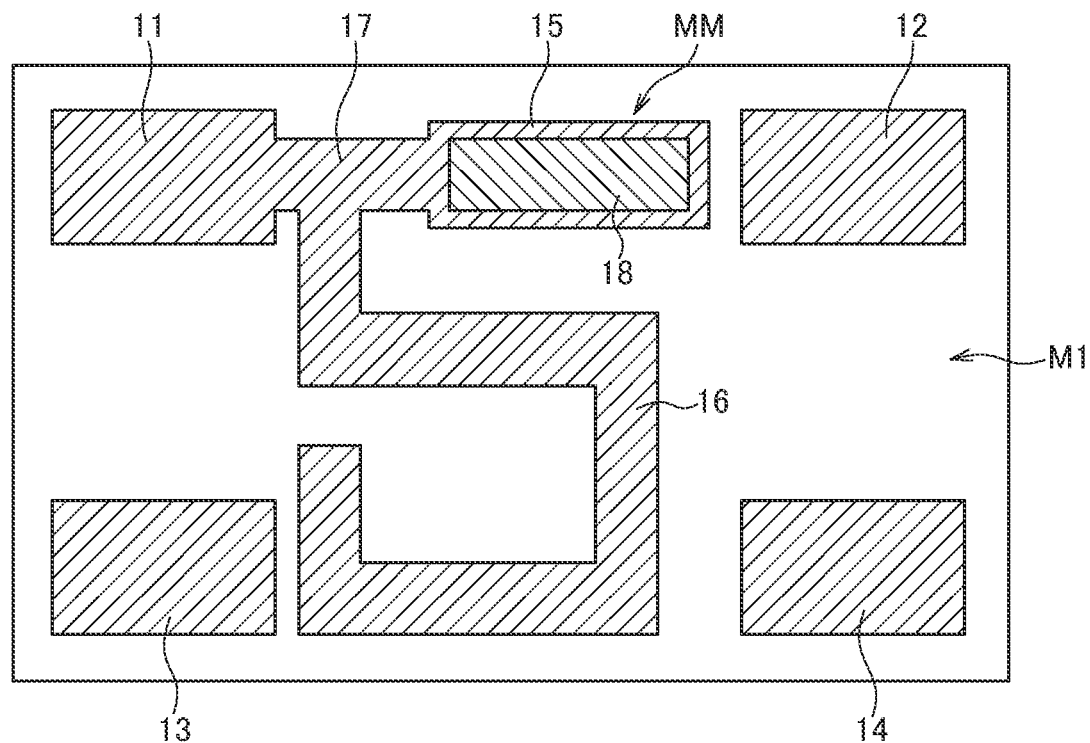
FIG. 3 is a schematic plan view for indicating pattern shapes of conductor layers M1 and MM.

The conductor layer M1 is a conductor layer positioned in the lowermost layer and includes conductor patterns 11 to 17 as illustrated in FIG. 3. The conductor patterns 11 to 14 are terminal electrode patterns, the conductor pattern 15 is a capacitor lower electrode, and the conductor pattern 16 is an inductor pattern. One ends of the conductor pattern 15 constituting the lower electrode and the conductor pattern 16 constituting the inductor pattern are connected to the conductor pattern 11 through the conductor pattern 17. The conductor patterns 11 to 17 are each constituted of a thin seed layer S contacting the planarizing layer 3 and a plating layer P formed on the seed layer S and having a film thickness larger than that of the seed layer S. Similarly, the conductor patterns positioned in the conductor layers MM, M2, M3, and M4 are each formed of a stacked body of the seed layer S and plating layer P. Of the conductor patterns 11 to 17, at least the conductor pattern 15 constituting the capacitor lower electrode is covered at the upper and side surfaces thereof with a dielectric film (capacitive insulating film) 4.

A conductor pattern 18 is formed on the upper surface of the conductor pattern 15 through the dielectric film 4. The conductor pattern 18 belongs to the conductor layer MM positioned between the conductor layers M1 and M2 and constitutes a capacitor upper electrode. This forms a capacitor having the lower and upper electrodes constituted by the conductor patterns 15 and 18, respectively. The conductor layers M1 and MM are covered with the insulating layer 6 through a passivation film 5. In the present embodiment, the dielectric film 4 and the passivation film 5 are each made of an inorganic insulating material. The dielectric film 4 and the passivation film 5 may be made of the same or different inorganic insulating materials.

The conductor layer M2 is the second conductor layer, which is provided on the surface of the insulating layer 6. As illustrated in FIG. 4, the conductor layer M2 includes conductor patterns 21 to 27. The conductor patterns 21 to 24 are terminal electrode patterns, the conductor pattern 25 is a lead-out electrode of the capacitor, and the conductor pattern 26 is an inductor pattern. The conductor pattern 26 has the same pattern shape as the conductor pattern 16 and formed in the same plane position. Accordingly, the conductor patterns 16 and 26 overlap each other in a plan view. The conductor pattern 25 is connected to the conductor pattern 18 as the upper electrode through a via conductor 25a penetrating the insulating layer 6 and connected also to the conductor pattern 22. One end of the conductor pattern 26 constituting the inductor pattern is connected to the conductor pattern 21 through the conductor pattern 27 and connected also to one end of the conductor pattern 16 through a via conductor 26a penetrating the insulating layer 6. The other end of the conductor pattern 26 is connected to the other end of the conductor pattern 16 through a via conductor 27a penetrating the insulating layer 6. The conductor patterns 21 to 24 are connected respectively to the conductor patterns 11 to 14 through via conductors 21a to 24a penetrating the insulating layer 6. The conductor layer M2 is covered with the insulating layer 7.

The conductor layer M3 is the third conductor layer, which is provided on the surface of the insulating layer 7. As illustrated in FIG. 5, the conductor layer M3 includes conductor patterns 31 to 36. The conductor patterns 31 to 34 are terminal electrode patterns, the conductor pattern 35 is an inductor lead-out electrode, and the conductor pattern 36 is an inductor pattern. One end of the conductor pattern 36 constituting the inductor pattern is connected to the other end of the conductor pattern 26 through a via conductor 36a penetrating the insulating layer 7, and the other end thereof is connected to the conductor patterns 33 and 34 through the conductor pattern 35. The conductor patterns 31 to 34 are connected respectively to the conductor patterns 21 to 24 through via conductors 31a to 34a penetrating the insulating layer 7. The conductor layer M3 is covered with the insulating layer 8 positioned in the uppermost layer.

The conductor layer M4 is the fourth conductor layer, which is provided on the surface of the insulating layer 8. As illustrated in FIG. 1, the conductor layer M4 includes terminal electrodes 41 to 44. The terminal electrodes 41 to 44 are connected respectively to the conductor patterns 31 to 34 through via conductors 41a to 44a penetrating the insulating layer 8.

Figure 6:
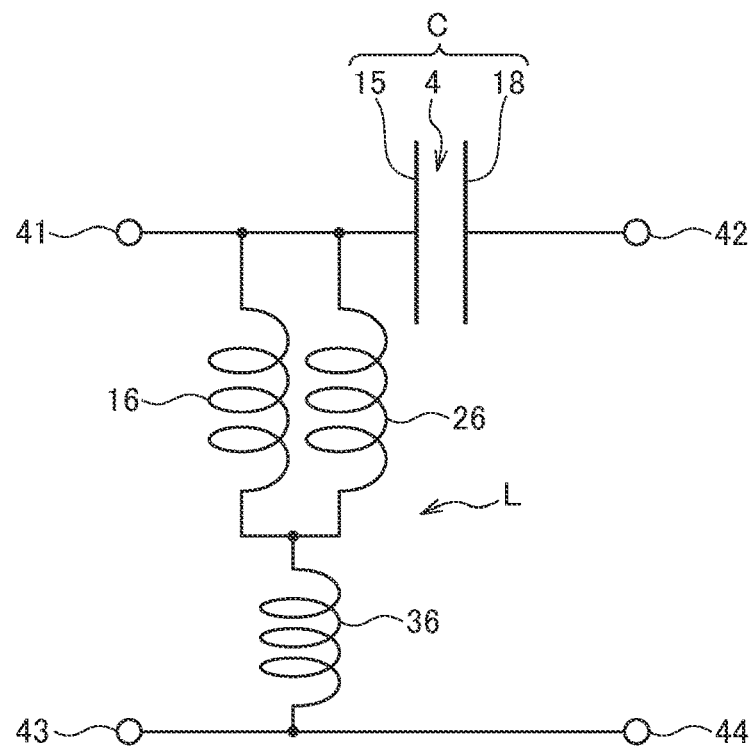
FIG. 6 is an equivalent circuit diagram of the electronic component 1.

FIG. 6 is an equivalent circuit diagram of the electronic component 1 according to the present embodiment.

As illustrated in FIG. 6, the electronic component 1 according to the present embodiment has a circuit configuration having a capacitor C connected between the terminal electrodes 41 and 42 and an inductor L connected between the terminal electrode 41 and the terminal electrodes 43, 44. The capacitor C is constituted of the conductor pattern 15 as the lower electrode, the conductor pattern 18 as the upper electrode, and the dielectric film 4 positioned between the conductor patterns 15 and 18. The inductor L has a circuit configuration in which a parallel coil constituted of the conductor patterns 16 and 26 and a coil constituted of the conductor pattern 36 are connected in series.

As illustrated in FIG. 2, in the present embodiment, a conductor thickness H1 of the conductor layer M1 is smaller than a conductor thickness H2 of the conductor layer M2. A reduction in the conductor thickness H1 of the conductor layer M1 reduces a level difference formed by the dielectric film 4 and passivation film 5. This relieves a stress to make the dielectric film 4 and the conductor layer M1 less susceptible to interfacial peeling. On the other hand, the reduction in the conductor thickness H1 of the conductor layer M1 increases the resistance value of the conductor layer M1, so that when the conductor pattern 16 belonging to the conductor layer M1 is used as an inductor pattern without any alteration, characteristics of the LC filter may deteriorate. Considering this, in the electronic component 1 according to the present embodiment, the conductor pattern 16 belonging to the conductor layer M1 and the conductor pattern 26 belonging to the conductor layer M2 are connected in parallel to reduce the resistance value. Thus, it is possible to reduce the resistance value of the inductor L while preventing interfacial peeling between the dielectric film 4 and the conductor layer M1.

Although not particularly limited, the conductor thicknesses of the conductor layers M3 and M4 are preferably approximately equal to the conductor thickness H2 of the conductor layer M2.

As illustrated in FIG. 1, the insulating layer 8 positioned in the uppermost layer has a substantially rectangular plane shape. The insulating layer 8 has protruding parts 81 to 84 protruding in the planar direction from sides E1 to E4 in a plan view. Specifically, in a plan view, when the sides of the insulating layer 8 that extend in the x-direction are represented respectively as E1 and E2, and the sides of the insulating layer 8 that extend in the y-direction are represented respectively as E3, E4, the protruding parts 81 and 82 protrude in the y-direction from the substantially center portions of the respective sides E1 and E2, and the protruding parts 83 and 84 protrude in the x-direction from the substantially center portions of the respective sides E3 and E4. Further, the x-direction position of the protruding part 81 does not overlap the terminal electrodes 41 and 42, the x-direction position of the protruding part 82 does not overlap the terminal electrodes 43 and 44, the y-direction position of the protruding part 83 does not overlap the terminal electrodes 41 and 43, and the y-direction position of the protruding part 84 does not overlap the terminal electrodes 42 and 44. That is, when sections of the side E1 that are adjacent to the terminal electrodes 41 and 42 (sections that overlap the terminal electrodes 41 and 42 in the y-direction) are represented respectively as S1 and S2, the protruding part 81 is positioned between the section S1 and the section S2. The same applies to the other protruding parts 82 to 84.

The protruding amount of each of the protruding parts 81 to 84 is set so as not to allow the insulating layer 8 to exceed the outer edge of the substrate 2, which means that the protruding parts 81 to 84 overlap the substrate 2 in a plan view and do not protrude from the outer edge of the substrate 2. This prevents the planar size of the electronic component 1 from increasing due to the presence of the protruding parts 81 to 84. The edges of the protruding parts 81 to 84 may be flush with the side surface of the substrate 2.

Figure 7:
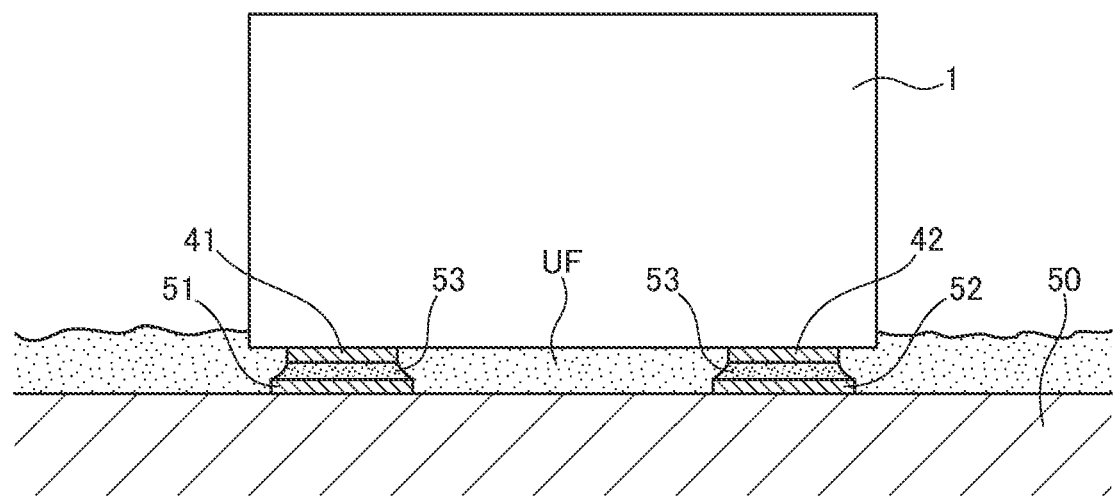
FIG. 7 is a schematic cross-sectional view illustrating a state where the electronic component 1 is mounted on a motherboard 50.

FIG. 7 is a schematic cross-sectional view illustrating a state where the electronic component 1 according to the present embodiment is mounted on a motherboard 50.

Figure 8:
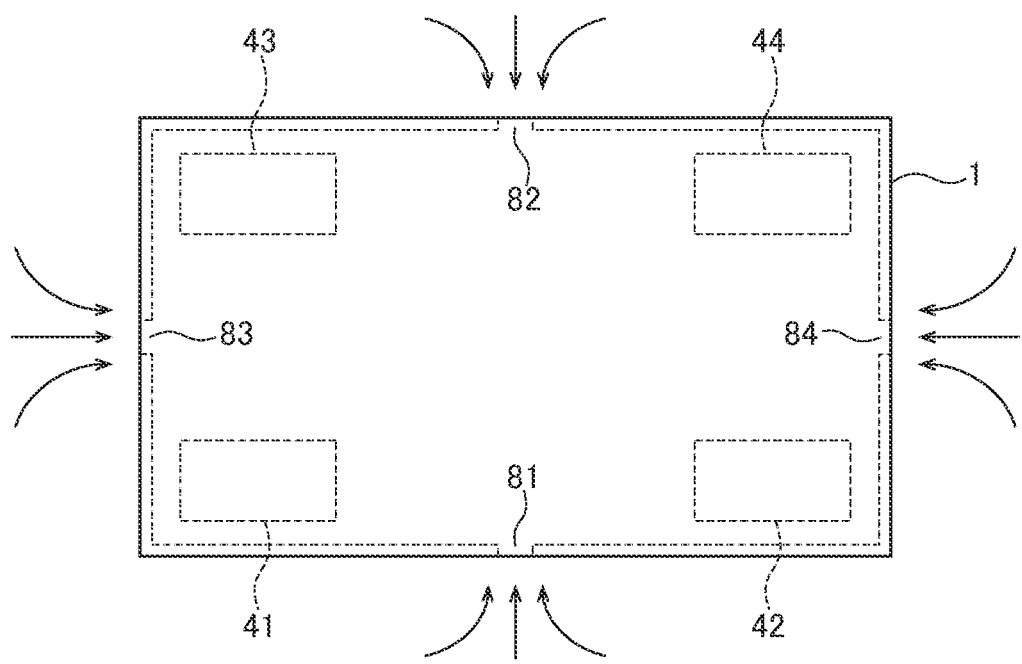
FIG. 8 is a schematic plan view for explaining a flow of an underfill UF.

As illustrated in the cross-sectional view of FIG. 7, the electronic component 1 is mounted such that the terminal electrodes 41 and 42 thereof are connected respectively to land patterns 51 and 52 formed on the motherboard 50 each through a solder 53. For higher reliability, an underfill UF is filled in a gap between the motherboard 50 and the electronic component 1. More specifically, after mounting of the electronic component 1 on the motherboard 50, a low-viscosity underfill UF is supplied to the surface of the motherboard 50. In this process, when the gap between the motherboard 50 and the electronic component 1 is small, the underfill UF is difficult to penetrate thereinto; however, in the present embodiment, the insulating layer 8, which is positioned in the lowermost layer in a state where the electronic component 1 is mounted on the motherboard 50, has the protruding parts 81 to 84, so that, as denoted by the arrows in the schematic plan view of FIG. 8, surface tension originating from the protruding parts 81 to 84 facilitates smooth penetration of the underfill UF into the gap between the motherboard 50 and the electronic component 1.

Further, in the present embodiment, the four protruding parts 81 to 84 are formed in the substantially center portions of the respective sides E1 to E4 of the insulating layer 8, so that the underfill UF enters in four directions. In addition, the protruding parts 81 to 84 are formed at positions not interfering with the terminal electrodes 41 to 44, allowing the underfill UF entering from the protruding parts 81 to 84 to easily spread over the entire gap between the motherboard 50 and the electronic component 1.

The following describes a manufacturing method for the electronic component 1 according to the present embodiment.

FIGS. 9 to 21 are process views for explaining the manufacturing method for the electronic component 1 according to the present embodiment. While many pieces of the electronic components 1 are obtained from an aggregate substrate in the manufacturing process of the electronic component 1, the following description will focus on the manufacturing process of a single electrode component 1 as illustrated in FIGS. 9 through 21.

Figure 9:
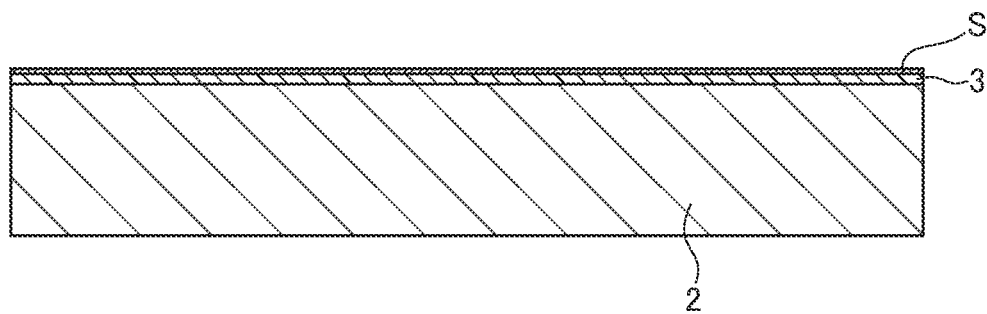
FIGS. 9 to 21 are process views for explaining the manufacturing method for the electronic component 1.
Figure 10:
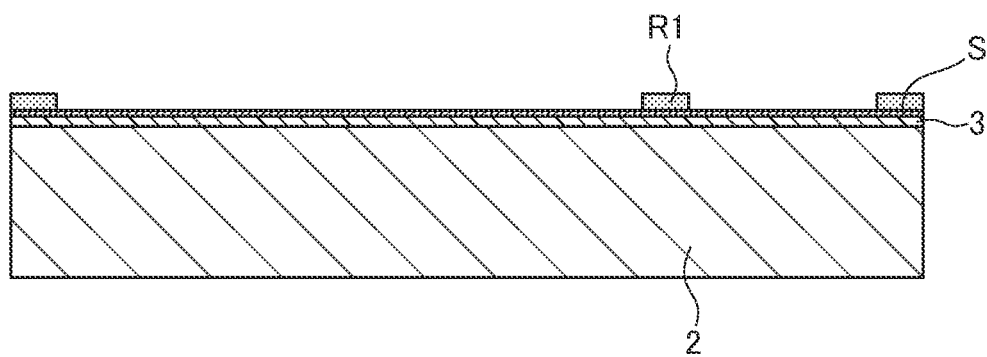
Figure 11:
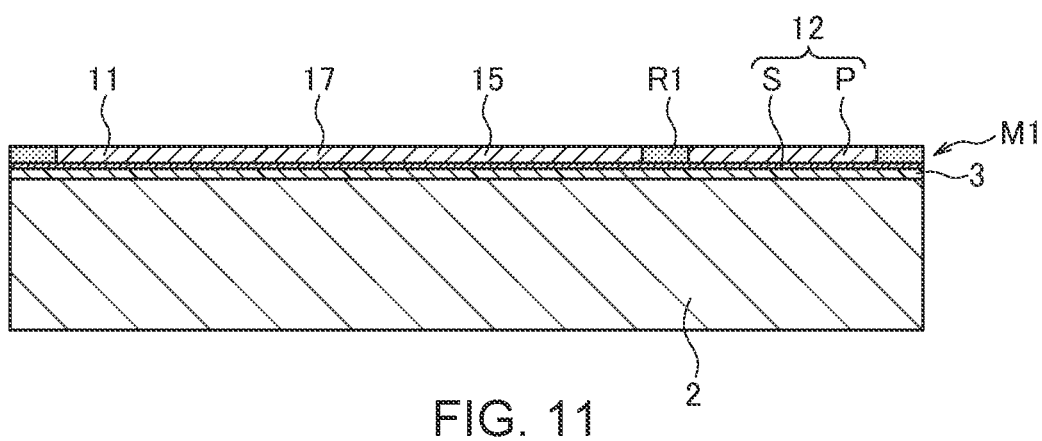
Figure 12:
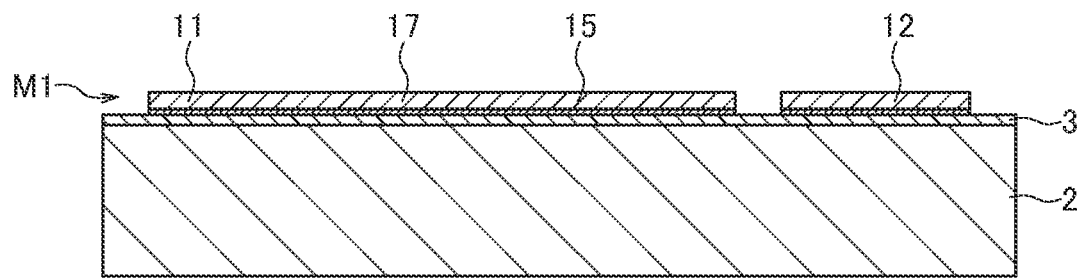

As illustrated in FIG. 9, the planarizing layer 3 is formed by sputtering or the like on the substrate (aggregate substrate, at this time point) 2, and the surface of the planarizing layer 3 is subjected to grinding or mirror finishing such as CMP for planarization. Thereafter, the seed layer S is formed by sputtering or the like on the surface of the planarizing layer 3. Subsequently, as illustrated in FIG. 10, a resist layer R1 is spin-coated on the seed layer S and then patterned so as to expose a part of the seed layer S on which the conductor layer M1 is to be formed. In this state, electroplating is performed using the seed layer S as a feeder to form a plating layer P on the seed layer S as illustrated in FIG. 11. A stacked body of the seed layer S and plating layer P constitutes the conductor layer M1. In the cross section illustrated in FIG. 11, the conductor layer M1 includes the conductor patterns 11, 12, 15, and 17. Then, as illustrated in FIG. 12, the resist layer R1 is removed, and then the exposed seed layer S is removed, whereby the conductor layer M1 is completed. The removal of the seed layer S can be achieved by etching or ion milling.

Figure 22:
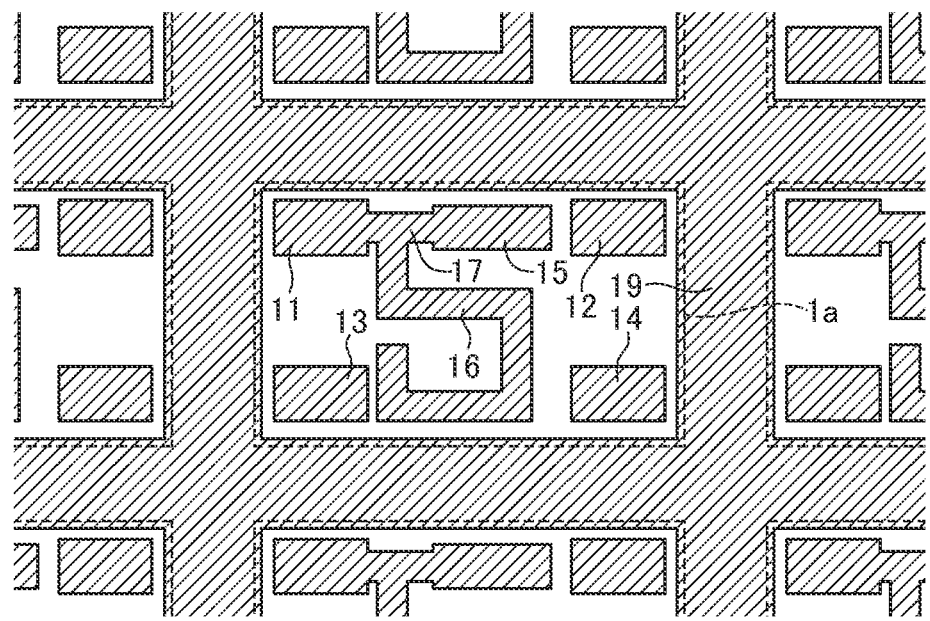
FIG. 22 is a schematic plan view illustrating a state immediately after formation of the conductor layer M1.

FIG. 22 is a schematic plan view illustrating a state immediately after formation of the conductor layer M1. The area surrounded by the dashed line 1a in FIG. 22 is an area corresponding to one electronic component 1 to be finally obtained. The area outside the dashed line 1a corresponds to a cutting margin for dicing. As illustrated in FIG. 22, a sacrificial pattern 19 constituting a part of the conductor layer M1 is formed on the area corresponding to the cutting margin and the area slightly inside the dashed line 1a.

Figure 13:
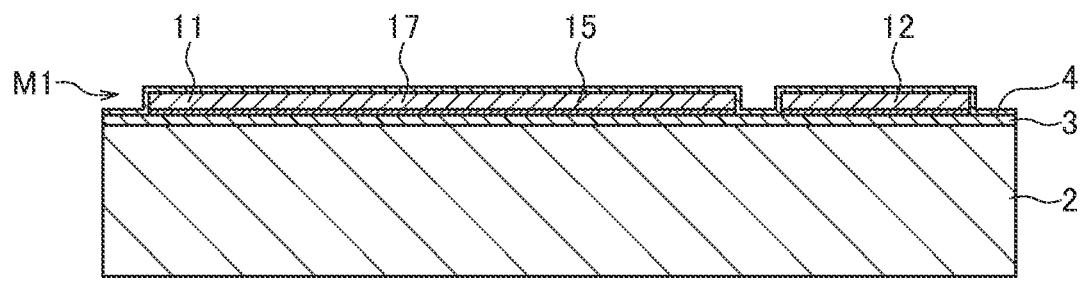

Then, as illustrated in FIG. 13, the dielectric film 4 is formed on the entire surface of the conductor layer M1 including the upper and side surfaces thereof. The dielectric film 4 may be made of, e.g., a paraelectric material such as silicon nitride (SiNx) or silicon oxide (SiOx), or a known ferroelectric material. The dielectric film 4 can be formed by sputtering, plasma CVD, MOCVD, sol-gel, electron beam vapor deposition, or the like.

Figure 14:
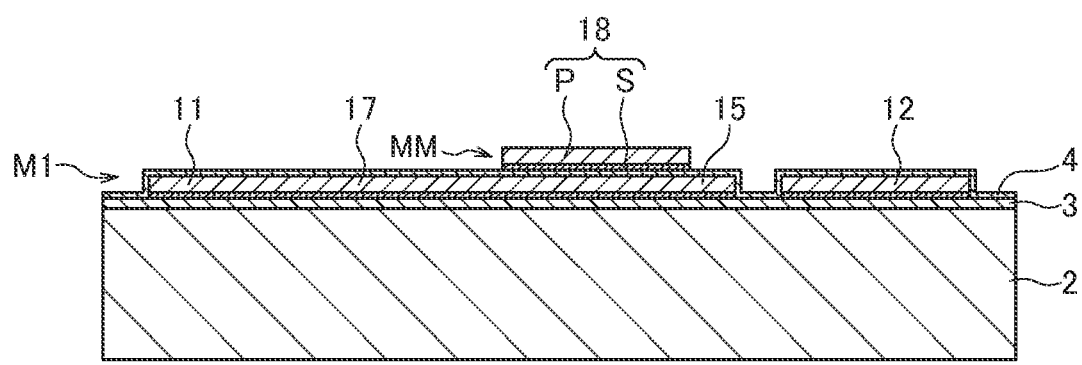
Figure 23:
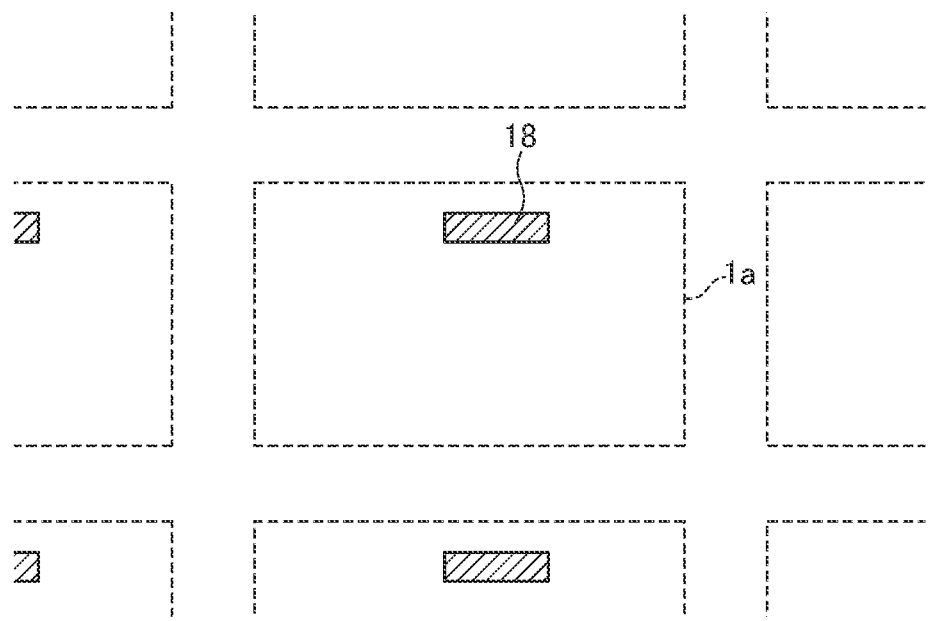
FIG. 23 is a schematic plan view illustrating a state immediately after formation of the conductor layer MM.

Then, as illustrated in FIG. 14, the conductor pattern 18 is formed on the upper surface of the conductor pattern 15 through the dielectric film 4 using the same method as the formation method for the conductor layer M1. The conductor pattern 18 is also formed of a stacked body of the seed layer S and plating layer P. This completes the conductor layer MM to thereby form a capacitor having the lower and upper electrodes constituted by the conductor patterns 15 and 18, respectively. FIG. 23 is a schematic plan view illustrating a state immediately after formation of the conductor layer MM.

Figure 15:
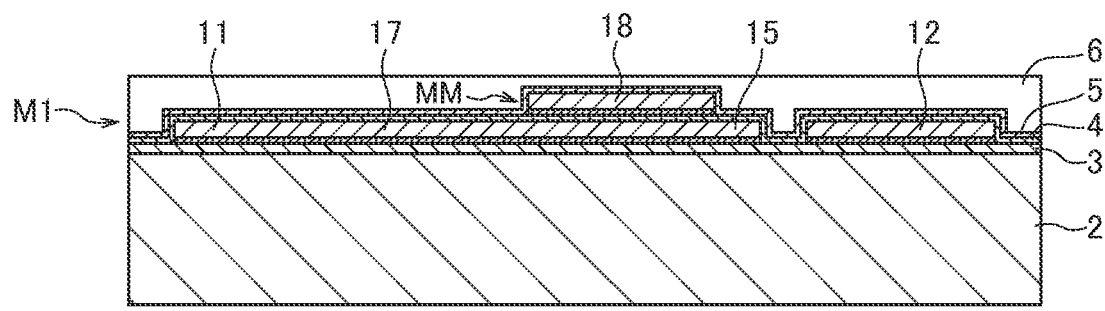
Figure 16:
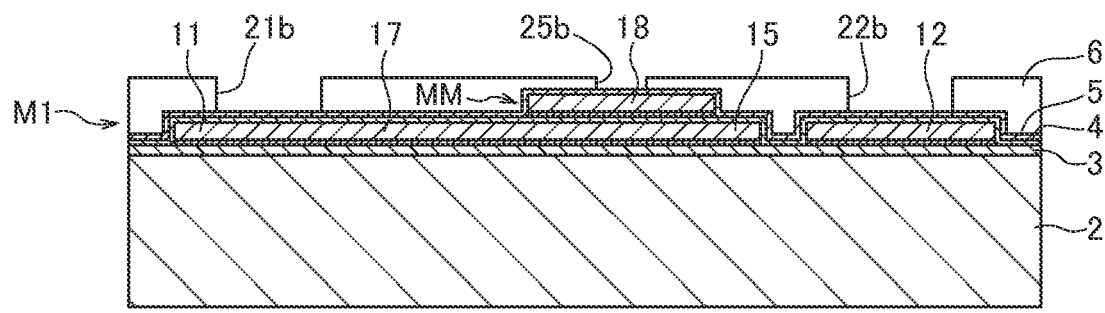
Figure 24:
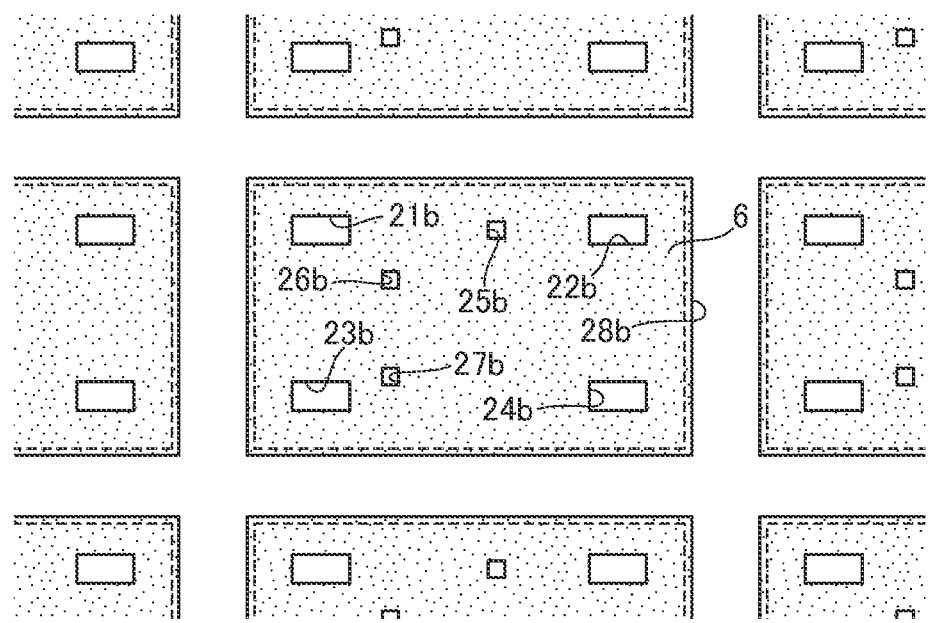
FIG. 24 is a schematic plan view illustrating a state immediately after formation of the vias 21b to 28b in the insulating layer 6.

Then, as illustrated in FIG. 15, the passivation film 5 is formed so as to cover the conductor layers M1 and MM, followed by formation of the insulating layer 6. The formed insulating layer 6 is then patterned to form vias 21b to 28b in the insulating layer 6 as illustrated in FIG. 16. FIG. 24 is a schematic plan view illustrating a state immediately after formation of the vias 21b to 28b in the insulating layer 6. As a result, the passivation film 5 that covers the conductor layers M1 or MM is exposed to the bottom portions of the vias 21b to 28b.

Figure 17:
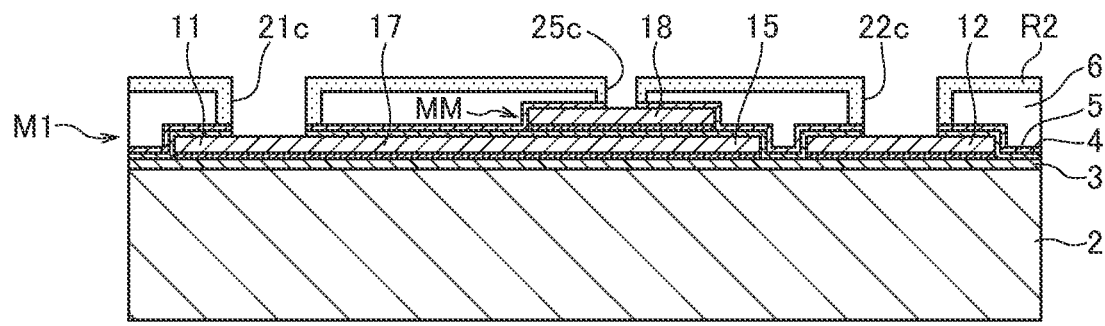

Then, as illustrated in FIG. 17, a resist layer R2 is formed on the insulating layer 6, followed by formation of openings 21c, 22c, and 25c that overlap the vias 21b, 22b, and 25b, respectively, in the resist layer R2. In this state, ion milling or the like is applied to remove the passivation film 5 exposed to the opening 25c and remove the passivation film 5 and dielectric film 4 both exposed to the openings 21c and 22c, thereby exposing the upper surfaces of the conductor layers M1 and MM. Although not illustrated in FIG. 17, similar openings are formed for the via 23b, 24b, and 26b to 28b. As a result, the sacrificial pattern 19 is exposed to the bottom portion of the via 28b.

Figure 18:
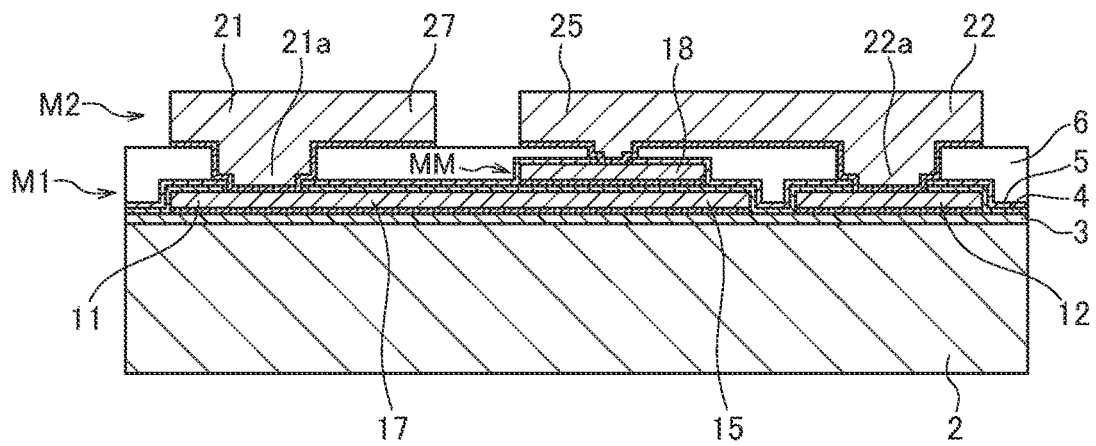
Figure 25:
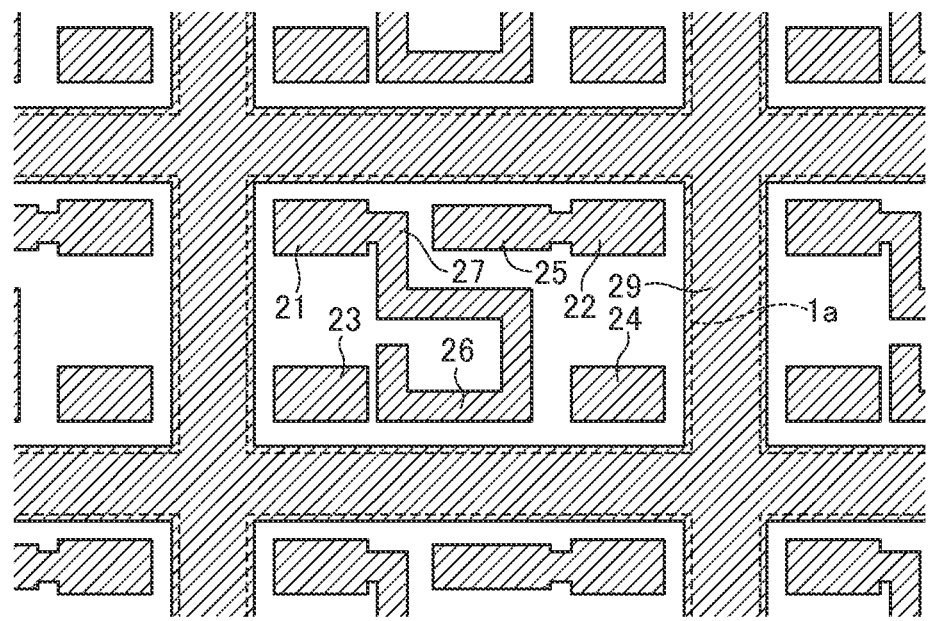
FIG. 25 is a schematic plan view illustrating a state immediately after formation of the conductor layer M2.

Then, the resist layer R2 is removed, and then the conductor layer M2 is formed on the insulating layer 6 using the same method as the formation method for the conductor layer M1 as illustrated in FIG. 18. FIG. 25 is a schematic plan view illustrating a state immediately after formation of the conductor layer M2. As illustrated in FIG. 25, the sacrificial pattern 29 constituting a part of the conductor layer M2 is formed on the area corresponding to the cutting margin and the area slightly inside the dashed line 1a.

Figure 19:
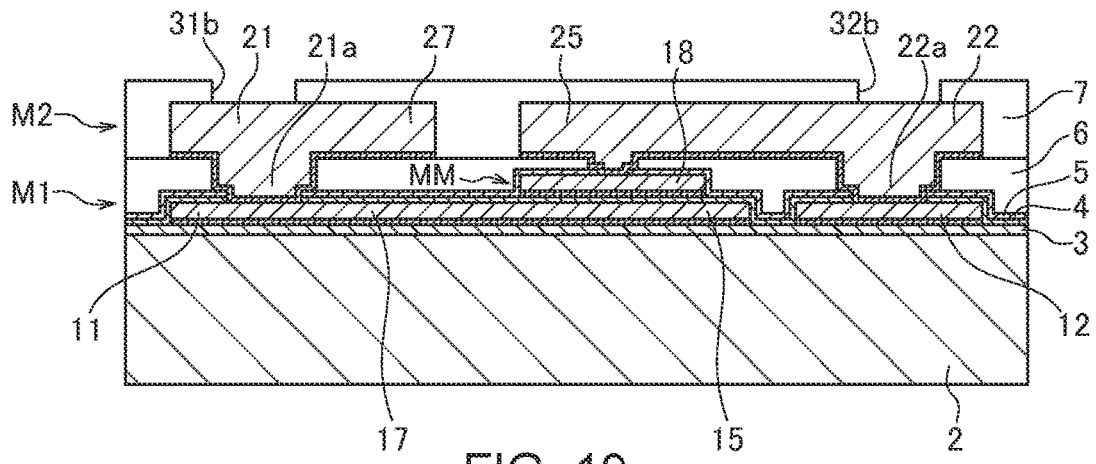
Figure 26:
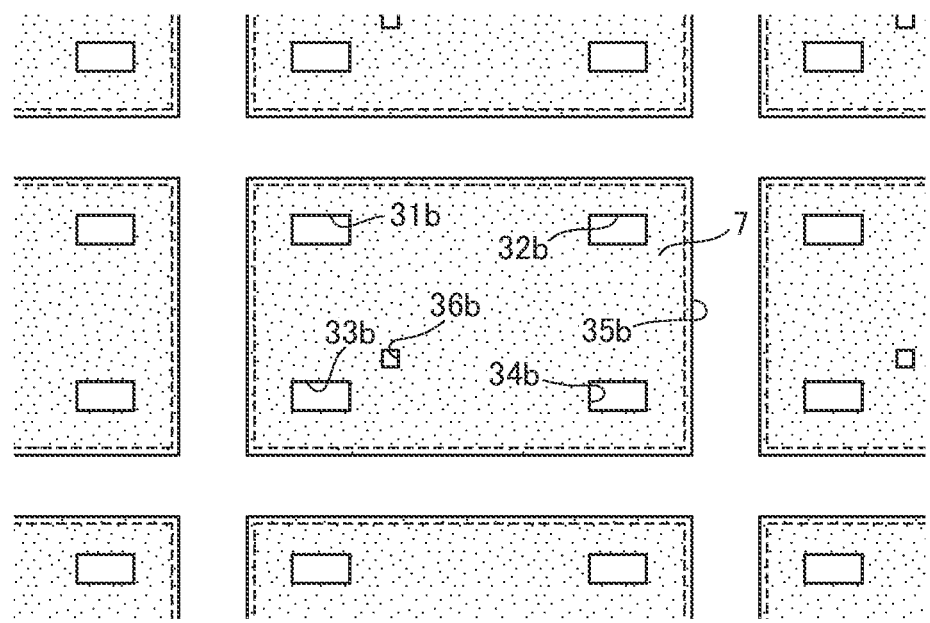
FIG. 26 is a schematic plan view illustrating a state after formation of the vias 31b to 36b in the insulating layer 7.

Then, as illustrated in FIG. 19, the insulating layer 7 is formed so as to cover the conductor layer M2 and then patterned to form vias 31b to 36b in the insulating layer 7. FIG. 26 is a schematic plan view illustrating a state after formation of the vias 31b to 36b in the insulating layer 7. As a result, the conductor layer M2 is exposed at the bottom portions of the vias 31b to 36b. The sacrificial pattern 29 is exposed to the bottom portion of the via 35b.

Figure 20:
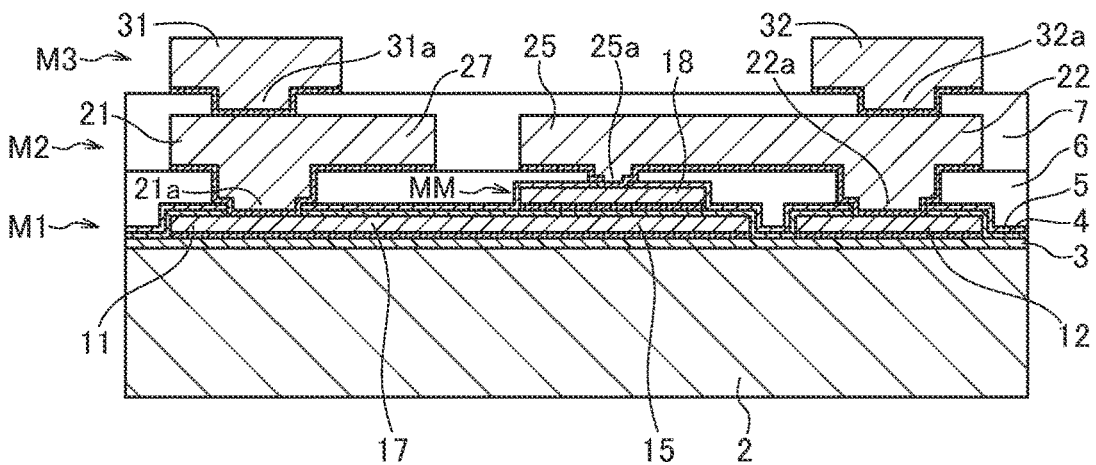
Figure 27:
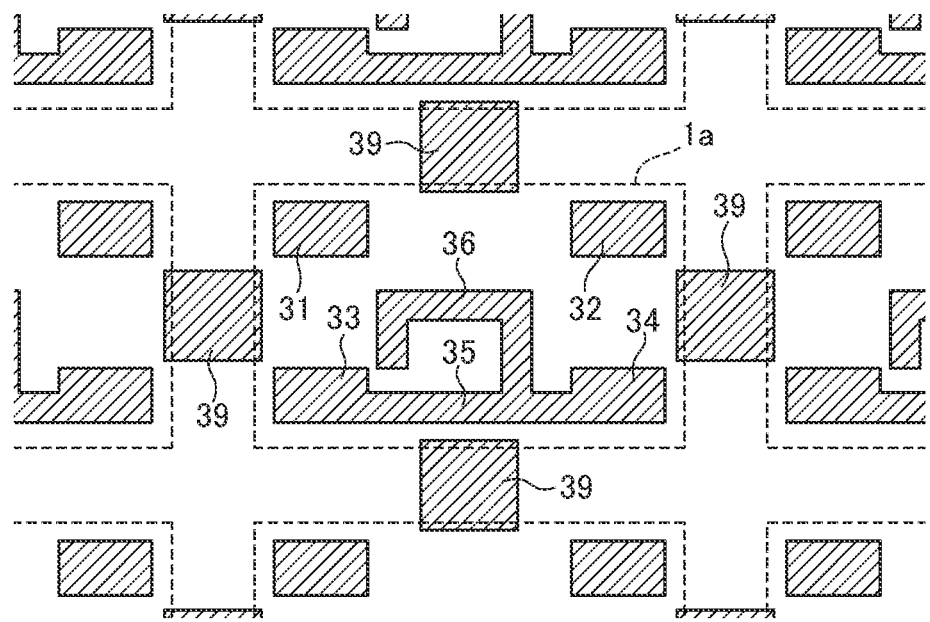
FIG. 27 is a schematic plan view illustrating a state immediately after formation of the conductor layer M3.

Then, as illustrated in FIG. 20, the conductor layer M3 is formed on the insulating layer 7 using the same method as the formation method for the conductor layers M1 and M2. FIG. 27 is a schematic plan view illustrating a state immediately after formation of the conductor layer M3. As illustrated in FIG. 27, a sacrificial pattern 39 constituting a part of the conductor layer M3 is formed on the area corresponding to the cutting margin and the area slightly inside the dashed line 1a. The sacrificial pattern 39 is formed so as to overlap substantially the center portion of a part corresponding to each side of the electronic component 1 in a plan view.

Figure 21:
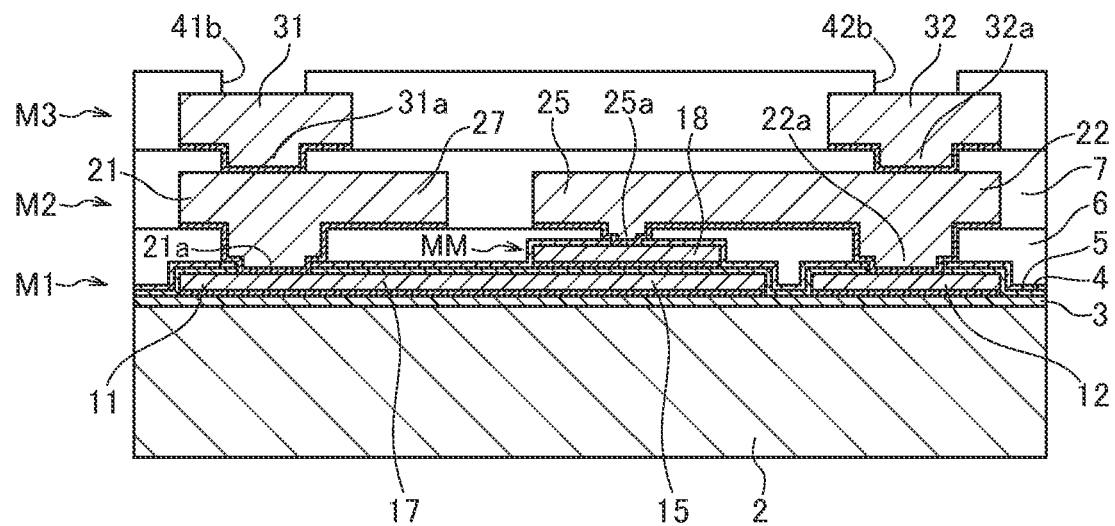
Figure 28:
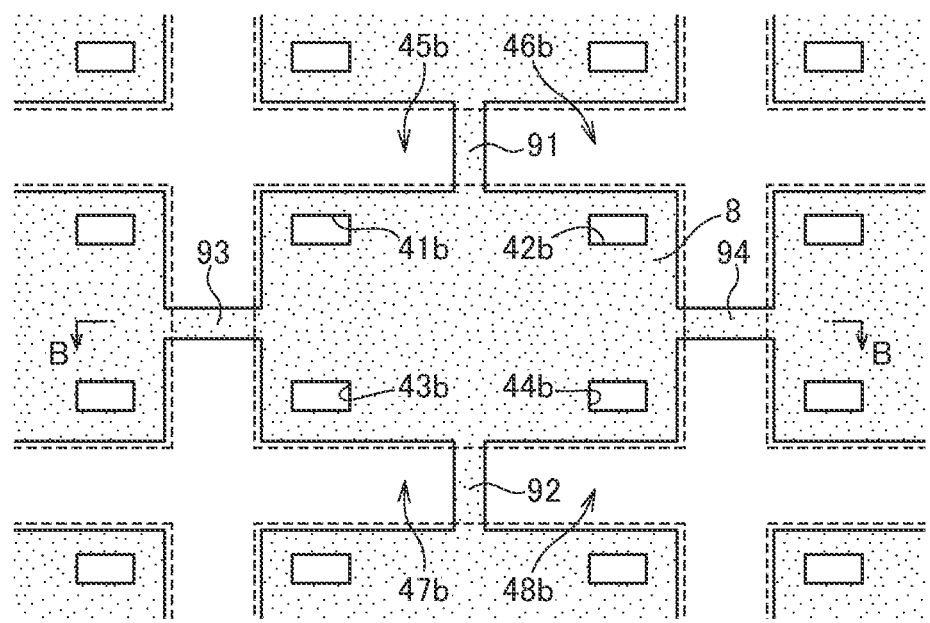
FIG. 28 is a schematic plan view illustrating a state immediately after formation of the vias 41b to 48b in the insulating layer 8.

Then, as illustrated in FIG. 21, the insulating layer 8 is formed so as to cover the conductor layer M3 and then patterned to form vias 41b to 48b in the insulating layer 8. FIG. 28 is a schematic plan view illustrating a state immediately after formation of the vias 41b to 48b in the insulating layer 8. Thus, the conductor patterns 31 to 34 are exposed respectively to the bottom portions of the vias 41b to 44b, and the sacrificial patterns 29 and 39 are both exposed to the bottom portions of the vias 45b to 48b.

Figure 29:
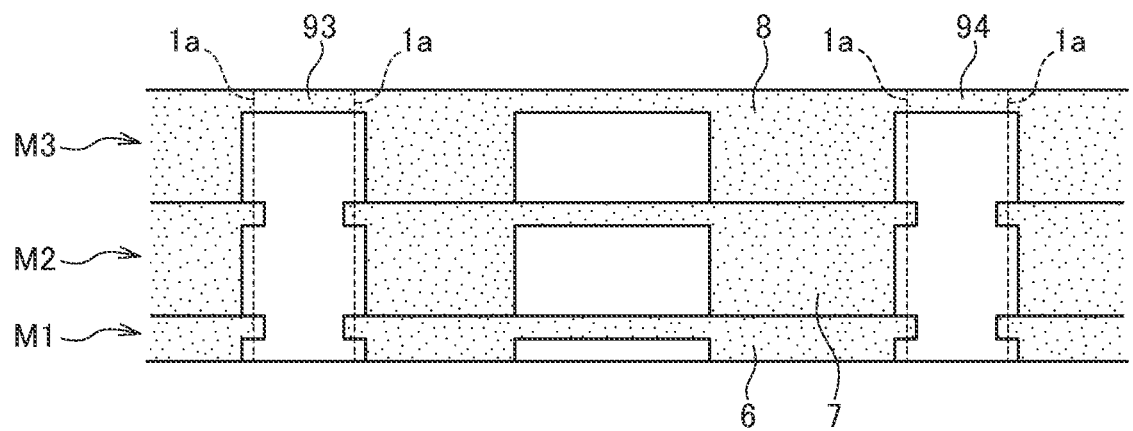
FIG. 29 is a schematic cross-sectional view taken along line B-B in FIG. 28.

FIG. 29 is a schematic cross-sectional view taken along line B-B in FIG. 28.

As illustrated in FIGS. 28 and 29, the insulating layer 8 positioned in the uppermost layer is not formed along the entire outer periphery of each electronic component but has bridge parts 91 to 94 that partially connect adjacent electronic components. Specifically, the insulating layer 8 belonging to the electronic component positioned in the center of FIG. 28 connects to the insulating layer 8 belonging to the electronic component positioned on the upper side through the bridge part 91, connects to the insulating layer 8 belonging to the electronic component positioned on the lower side through the bridge part 92, connects to the insulating layer 8 belonging to the electronic component positioned on the left side through the bridge part 93, and connects to the insulating layer 8 belonging to the electronic component positioned on the right side through the bridge part 94.

The, as illustrated in FIG. 2, the conductor layer M4 is formed on the insulating layer 8 using the same method as the formation method for the conductor layers M1 to M3. In the formation process of the conductor layer M4, a seed layer S is formed on the entire surface of the insulating layer 8, and then electroplating is performed using the seed layer S as a feeder to form the terminal electrodes 41 to 44. The insulating layer 8 undergoes shrinkage in a curing step after formation of the vias 41b to 48b, which may cause peeling in the interface between the insulating layer 8 and the conductor layer M3. When peeling occurs in the interface between the insulating layer 8 and the conductor layer M3, the seed layer S may break in the peeled-off portion, and the seed layer S may partially undergo electrical disconnection depending on the severity of the peeling.

However, in the present embodiment, the insulating layer 8 has the bridge parts 91 to 94, so that even if partial peeling occurs in the interface between the insulating layer 8 and the conductor layer M3, electrical connection is maintained by the seed layer S formed on the surfaces of the bridge parts 91 to 94. This allows the terminal electrodes 41 to 44 to be formed correctly through the electroplating performed using the seed layer S as a feeder.

Then, the sacrificial patterns 19, 29, and 39 are removed using etchant such as acid with the terminal electrodes 41 to 44 covered with a not-shown resist layer. Subsequently, the substrate 2 is diced into individual semiconductor chips so as to cut the bridge parts 91 to 94, whereby the electronic component 1 according to the present embodiment is completed. The cutting of the bridge parts 91 to 94 in the dicing process results in formation of the protruding parts 81 to 84 illustrated in FIG. 1 in the insulating layer 8. That is, the protruding part (81 to 84) forms a part of the bridge part (91 to 94).

As described above, the manufacturing process of the electronic component 1 according to the present embodiment is featured in that, upon formation of the vias in the insulating layer 8 positioned in the uppermost layer, the insulating layers 8 belonging to the adjacent individual electronic components are not separated from each other by the vias but are connected through the bridge parts 91 to 94. This can prevent electroplating failures due to breakage of the seed layer S.

Figure 30:
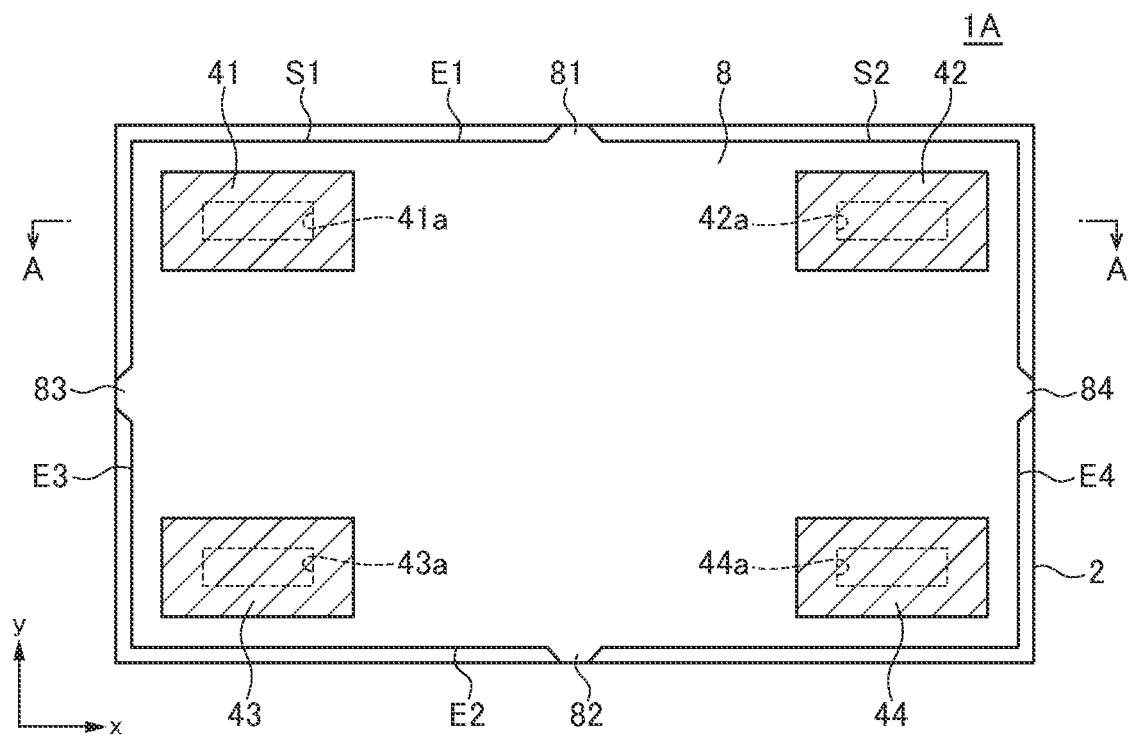
FIG. 30 is a schematic plan view for explaining the structure of an electronic component 1A according to a first modification.

FIG. 30 is a schematic plan view for explaining the structure of an electronic component 1A according to a first modification.

The electronic component 1A according to the first modification differs from the electronic component 1 according to the above embodiment in that the protruding parts 81 to 84 each have a tapered shape in a plan view. Other basic configurations are the same as those of the electronic component 1 according to the above embodiment, so the same reference numerals are given to the same elements, and overlapping description will be omitted. As exemplified by the electronic component 1A according to the first modification, the protruding parts 81 to 84 may have any planar shape.

Figure 31:
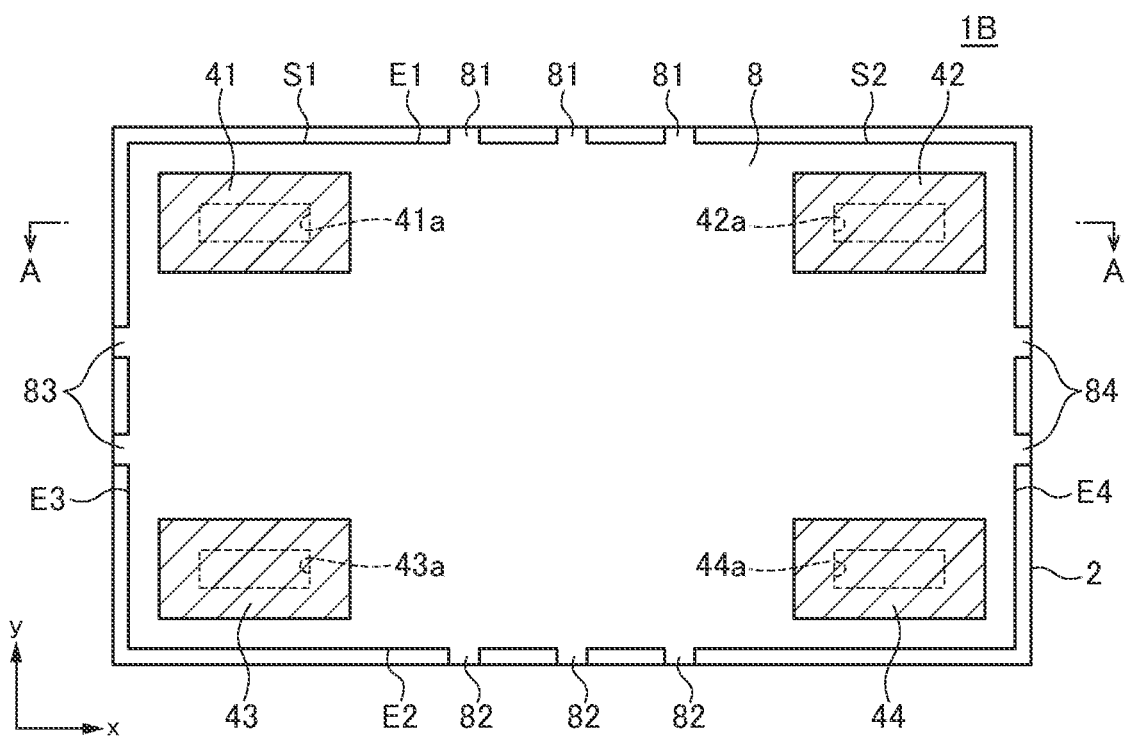
FIG. 31 is a schematic plan view for explaining the structure of an electronic component 1B according to a second modification.

FIG. 31 is a schematic plan view for explaining the structure of an electronic component 1B according to a second modification.

The electronic component 1B according to the second modification differs from the electronic component 1 according to the above embodiment in that the protruding parts 81 to 84 are each provided in multiple numbers. Other basic configurations are the same as those of the electronic component 1 according to the above embodiment, so the same reference numerals are given to the same elements, and overlapping description will be omitted. Specifically, in the second modification, three protruding parts 81 and three protruding parts 82 are positioned respectively along the long sides E1 and E2, and two protruding parts 83 and two protruding parts 84 are positioned respectively along the short sides E3 and E4. As exemplified by the electronic component 1B according to the second modification, the protruding parts 81 to 84 are each not limited in number.

While the preferred embodiment of the present invention has been described, the present invention is not limited to the above embodiment, and various modifications may be made within the scope of the present invention, and all such modifications are included in the present invention.

For example, although the present invention is applied to an LC filter in the above embodiment, the target electronic component of the present invention is not limited to the LC filter, but may be electronic components of other types.

Further, although only the insulating layer 8 positioned in the uppermost layer has the bridge parts 91 to 94 in the above embodiment, the insulating layers 6 and 7 may also have the bridge parts.

What is claimed is:

1. An electronic component comprising:
    a substrate;
    a functional layer formed on the substrate and having a plurality of alternately stacked conductor layers and insulating layers, the functional layer including at least one of a capacitor and an inductor;
    a plurality of terminal electrodes provided on an uppermost one of the insulating layers,
    wherein the uppermost one of the insulating layers has a substantially rectangular planar shape and has a protruding part protruding in a planar direction from at least one side in a plan view, and
    wherein the protruding part is positioned in substantially a center portion of one side.

2. The electronic component as claimed in claim 1, wherein the protruding part overlaps the substrate in a plan view.

3. The electronic component as claimed in claim 1,
    wherein the plurality of terminal electrodes include first and second terminal electrodes,
    wherein the side of the uppermost one of the insulating layers has first and second sections adjacent respectively to the first and second terminal electrodes, and
    wherein the protruding part is positioned between the first and second sections.

* * * * *